US012805361B2

(12) United States Patent
Chen et al.

(10) Patent No.: US 12,805,361 B2
(45) Date of Patent: Nov. 17, 2026

(54) METHOD FOR MANUFACTURING EMBEDDED DEVICE PACKAGING SUBSTRATE, PACKAGING SUBSTRATE, AND SEMICONDUCTOR

(71) Applicant: Zhuhai ACCESS Semiconductor Co., LTD., Zhuhai City (CN)

(72) Inventors: Xianming Chen, Zhuhai City (CN); Gao Huang, Zhuhai City (CN); Yejie Hong, Zhuhai City (CN); Wenjian Lin, Zhuhai City (CN); Benxia Huang, Zhuhai City (CN); Zhijun Zhang, Zhuhai City (CN)

(73) Assignee: Zhuhai ACCESS Semiconductor Co., LTD., Zhuhai City (CN)

( * ) Notice: Subject to any disclaimer, the term of this patent is extended or adjusted under 35 U.S.C. 154(b) by 427 days.

(21) Appl. No.: 18/455,553

(22) Filed: Aug. 24, 2023

(65) Prior Publication Data

US 2024/0222245 A1 Jul. 4, 2024

(30) Foreign Application Priority Data

Dec. 30, 2022 (CN) ........................ 202211722246.0

(51) Int. Cl.
*H10W 70/685* (2026.01)
*H05K 1/02* (2006.01)
(Continued)

(52) U.S. Cl.
CPC ........ *H10W 70/685* (2026.01); *H05K 1/0298* (2013.01); *H05K 1/182* (2013.01); *H10W 70/05* (2026.01); *H05K 2201/10242* (2013.01)

(58) Field of Classification Search
CPC ........ H05K 1/182; H05K 1/185; H05K 1/186; H05K 1/187
See application file for complete search history.

(56) References Cited

U.S. PATENT DOCUMENTS

2023/0276576 A1* 8/2023 Chen ...................... H05K 3/423

FOREIGN PATENT DOCUMENTS

CN 114666995 A * 6/2022 ............ H05K 3/305
CN 115440675 A 12/2022
(Continued)

OTHER PUBLICATIONS

First Office Action for Japanese Patent Application No. 2023-137594 and English translation, mailed Jul. 16, 2024, 5 pages.
(Continued)

*Primary Examiner* — Nathan Milakovich
(74) *Attorney, Agent, or Firm* — Buchalter; Jason W. Croft

(57) ABSTRACT

A method for manufacturing embedded device packaging substrate, a packaging substrate, and a semiconductor are disclosed. The method includes: forming a first circuit layer; laminating a first photosensitive layer onto the first circuit layer; providing an embedded device on the first photosensitive layer, with a pin face of the embedded device facing away from the first photosensitive layer; providing a second photosensitive layer covering the embedded device; partially removing the first dielectric layer such that a minimum thickness of the first dielectric layer covering a side surface of the embedded device is greater than or equal to a preset threshold; providing a second dielectric layer covering the first dielectric layer; and forming, on the second dielectric layer, a second circuit layer that is electrically connected to the first circuit layer and the embedded device.

7 Claims, 4 Drawing Sheets

(51) Int. Cl.
*H05K 1/182* (2026.01)
*H10W 70/05* (2026.01)

(56) References Cited

FOREIGN PATENT DOCUMENTS

| | | | | | |
|---|---|---|---|---|---|
| JP | H03190238 | A | | 8/1991 | |
| JP | 2002246419 | A | | 8/2002 | |
| JP | 2020061542 | A | | 4/2020 | |
| KR | 20060095813 | A | | 9/2006 | |
| KR | 20070030700 | A | * | 3/2007 | ............. H05K 1/185 |
| KR | 20150146270 | A | * | 12/2015 | ........... H05K 3/4697 |
| TW | 202203331 | A | | 1/2022 | |

OTHER PUBLICATIONS

First Office Action for Korean Patent Application No. 10-2023-0117904 and English translation, mailed Aug. 1, 2024, 17 pages.

First Office Action for Taiwanese Patent Application No. 112128760 and English translation, mailed Mar. 27, 2024, 10 pages.

* cited by examiner

METHOD FOR MANUFACTURING EMBEDDED DEVICE PACKAGING SUBSTRATE, PACKAGING SUBSTRATE, AND SEMICONDUCTOR

CROSS-REFERENCE TO RELATED APPLICATION

This application is based on and claims the benefit of priority from Chinese Patent Application No. 2022117222460, filed on 30 Dec. 2022, the entirety of which is incorporated by reference herein.

TECHNICAL FIELD

The present disclosure relates to the field of semiconductor manufacturing technology, and in particular to a method for manufacturing embedded device packaging substrate, a packaging substrate, and a semiconductor.

BACKGROUND

In the existing technology, when preparing a substrate that requires an embedded device, the device is usually embedded with a frame. However, in the existing device embedding schemes, a copper-clad laminate (CCL)-based scheme may result in poor control over the thickness of the frame due to the limitation from the thickness of the CCL material, and moreover, removing the material by using mechanical or laser methods is slow and inefficient and not suitable for mass production. The coreless technique is another option, which results in a complex process but high-quality finished product, however, since the materials used are mainly organic materials, the overall mechanical strength is relatively weak, making it unsuitable for certain products that require high strength. A yet another option is manufacturing without a frame, the materials at the bottom and side of the embedded device are typically different types of materials having different coefficients of thermal expansion (CTEs), so that there is a risk of failure in later exposure to high-heat environments, and there is also a problem with poor bonding at the interface between the two materials, which may lead to a risk of delamination in the future. Therefore, there is an urgent demand for a new method for manufacturing embedded device packaging substrate.

SUMMARY

The present disclosure aims to solve one of the technical problems in the existing technology at least to a certain extent.

To this end, it is an objective of embodiments of the present disclosure to provide a method for manufacturing embedded device packaging substrate, a packaging substrate, and a semiconductor. The method for manufacturing embedded device packaging substrate can improve the bonding strength between materials and reduce the risk of delamination of the layers when exposed to heat later.

In order to achieve the technical objective, the technical scheme used by an embodiment of the present disclosure includes a method for manufacturing embedded device packaging substrate, the method including: forming a first circuit layer; laminating a first photosensitive layer onto the first circuit layer; providing an embedded device on the first photosensitive layer, with a pin face of the embedded device facing away from the first photosensitive layer; providing a second photosensitive layer in such a manner that the second photosensitive layer covers the embedded device, where materials of the first photosensitive layer and the second photosensitive layer are the same, and the first photosensitive layer and the second photosensitive layer form a first dielectric layer; partially removing the first dielectric layer such that a minimum thickness of the first dielectric layer covering a side surface of the embedded device is greater than or equal to a preset threshold; providing a second dielectric layer in such a manner that the second dielectric layer covers the first dielectric layer; and forming, on the second dielectric layer, a second circuit layer that is electrically connected to the first circuit layer and the embedded device.

In addition, the method for manufacturing embedded device packaging substrate according to the above embodiments of the present disclosure may also have the following additional technical features.

Further, in an embodiment of the present disclosure, the forming, on the second dielectric layer, a second circuit layer that is electrically connected to the first circuit layer and the embedded device includes: forming a first conductive copper pillar and a second conductive copper pillar, where the first conductive copper pillar is configured to connect the first circuit layer and the second circuit layer, and the second conductive copper pillar is configured to connect the second circuit layer and the embedded device; and forming the second circuit layer that is electrically connected to the first circuit layer and the embedded device through the first conductive copper pillar and the second conductive copper pillar.

Further, in an embodiment of the present disclosure, the forming the second circuit layer that is electrically connected to the first circuit layer and the embedded device through the first conductive copper pillar and the second conductive copper pillar includes: forming a metal seed layer connected to the first conductive copper pillar and the second conductive copper pillar; and performing a photosensitive film application process, an exposure and development process, and a pattern electroplating process on the metal seed layer to obtain the second circuit layer connected to the first conductive copper pillar and the second conductive copper pillar.

Further, in an embodiment of the present disclosure, the forming the first conductive copper pillar and the second conductive copper pillar includes: exposing the first circuit layer and the pin face of the embedded device through a laser drilling process to form a first through hole and a second through hole; and forming the first conductive copper pillar and the second conductive copper pillar in the first through hole and the second through hole, respectively, through a hole filling and electroplating process.

Further, in an embodiment of the present disclosure, the materials of the first photosensitive layer and the second photosensitive layer both include adhesive photosensitive materials.

Further, in an embodiment of the present disclosure, the second dielectric layer includes a resin-based dielectric material.

Further, in an embodiment of the present disclosure, the preset threshold is 3 μm.

In accordance with another aspect, an embodiment of the present disclosure also provides an embedded device packaging substrate, including: a first circuit layer, an embedded device, a second circuit layer, a first dielectric layer, and a second dielectric layer, where the first dielectric layer includes a first photosensitive layer and a second photosensitive layer; the first dielectric layer covers the embedded device; the second dielectric layer covers the first dielectric layer; the second dielectric layer is arranged between the first circuit layer and the second circuit layer; the first circuit layer is connected to the second circuit layer; and the second circuit layer is connected to the embedded device.

Further, in an embodiment of the present disclosure, the packaging substrate further includes: a first conductive copper pillar and a second conductive copper pillar, where the first conduction copper pillar is configured to electrically connect the first circuit layer and the second circuit layer, and the second conductive copper pillar is configured to electrically connect the second circuit layer and the embedded device.

In addition, the present disclosure also provides a semiconductor which includes the packaging substrate described in any of the above embodiments.

Some of the advantages and beneficial effects of the present disclosure will be set forth in the following description, and some will become apparent from the following description, or be learned by practice of the present disclosure.

According to the present disclosure, the embedded device may be attached to a photosensitive layer first and then a further photosensitive layer of the same material is applied again to package the embedded device, and an exposure and development process is performed such that the embedded device is covered with a certain thickness no less than a threshold, and then the photosensitive layers and hence the dielectric layer are covered by a second dielectric layer and a second circuit layer is formed thereon, thereby finally obtaining the embedded device packaging substrate. According to the present disclosure, the photosensitive layer at the bottom of the embedded device is made of the same material as the material on the side of the embedded device. This uniformity enhances the bonding strength between the materials and reduces the risk of delamination due to heating later. According to the present disclosure, by covering the embedded device with a certain thickness no less than a threshold before laminating the second dielectric layer, the embedded device can be protected. Moreover, according to the present disclosure, the strength of the finished product can be enhanced by applying the second dielectric layer, thereby reducing the risk of plate cracking in the future.

DETAILED DESCRIPTION

Hereinafter, embodiments of the present disclosure will be described in detail with reference to the accompanying drawings. The principle and process of the method for manufacturing embedded device packaging substrate, the structure of the packaging substrate, and the semiconductor including the packaging substrate according to the embodiments of the present disclosure will be described below.

Figure 1:
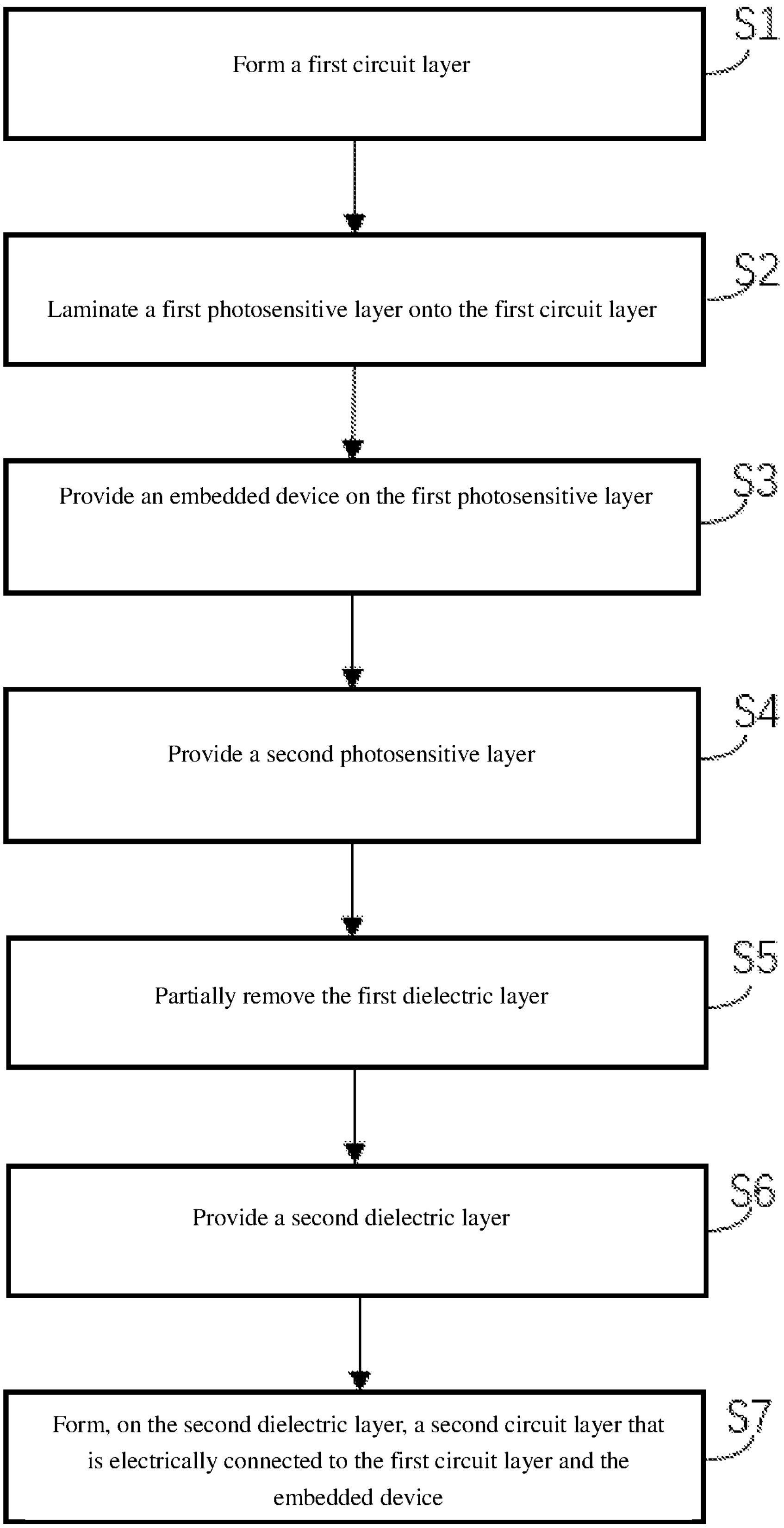
FIG. 1 is a flowchart of a method for manufacturing embedded device packaging substrate according to an embodiment of the present disclosure.

Referring to FIG. 1, a method for manufacturing embedded device packaging substrate of the present disclosure includes the following steps.

At S1, a first circuit layer is formed.

In this step, the first circuit layer may be formed on a semi-finished substrate, a carrier plate, or a temporary carrier plate. The first circuit layer may be designed according to specific needs. The first circuit layer can be formed by existing processes such as forming a metal seed layer, applying a photosensitive film to the seed layer, exposing and developing, and then etching, or can be produced using an electroplating process. The specific method for fabricating the first circuit layer is not limited herein. However, it should be noted that the first circuit layer in the present disclosure is not limited to one single layer, and may be a first circuit layer composed of a plurality of circuit layers which are electrically connected to each other.

At S2, a first photosensitive layer is laminated onto the first circuit layer.

After the first circuit layer is done, the first photosensitive layer can be laminated onto the first circuit layer in this step. During lamination, the first photosensitive layer can completely cover the entire first circuit layer or partially cover the first circuit layer. When the first photosensitive layer completely covers the first circuit layer, the projection of the first photosensitive layer onto the first circuit layer in a direction perpendicular to the first circuit layer completely overlap the first circuit layer; and when the first photosensitive layer partially covers the first circuit layer, the projection of the first photosensitive layer onto the first circuit layer in the direction perpendicular to the first circuit layer has an area smaller than that of the first circuit layer.

At S3, an embedded device is provided on the first photosensitive layer, with a pin face of the embedded device facing away from the first photosensitive layer.

In this step, the embedded device can be arranged on the first photosensitive layer, and the pin face of the embedded device needs to be arranged facing away from the first photosensitive layer. Specifically, if the embedded device is manipulated in a descending manner for attachment, the back face of the embedded device, i.e., the non-pin face, can be attached to the first photosensitive layer, while the pin face of the embedded device faces upward.

At S4, a second photosensitive layer is provided in such a manner that the second photosensitive layer covers the embedded device, where materials of the first photosensitive layer and the second photosensitive layer are the same, and the first photosensitive layer and the second photosensitive layer form a first dielectric layer.

In this step, the second photosensitive layer can be arranged on the first photosensitive layer and the embedded device, such that the second photosensitive layer can completely cover the first photosensitive layer and the embedded device. The second photosensitive layer can be provided by machine lamination or coating. The material of the second photosensitive layer can be the same as that of the first photosensitive layer. The photosensitive layers having the same material can improve the bonding strength between the photosensitive layers and reduce the risk of delamination of the layers when exposed to heat later. After the second photosensitive layer is arranged in place, the first photosensitive layer and the second photosensitive layer can form the first dielectric layer, which can completely cover the first circuit layer and enclose the embedded device.

At S5, the first dielectric layer is partially removed such that a minimum thickness of the first dielectric layer covering a side surface of the embedded device is greater than or equal to a preset threshold.

In this step, the first dielectric layer can be partially removed by an existing process such as exposure and etching. The removal can be done in a way that exposes the first circuit layer or keeps the first circuit layer covered. However, the minimum thickness of the first dielectric layer around the side surface of the embedded device after the removal should be greater than or equal to a certain preset threshold. The photosensitive layer around the side surface with a thickness no less than the preset threshold can protect the embedded device from damage during subsequent lamination processes, which could otherwise affect its performance.

At S6, a second dielectric layer is provided in such a manner that the second dielectric layer covers the first dielectric layer.

In this step, after partially removing the first dielectric layer, the second dielectric layer can be arranged on the first dielectric layer, or on the first dielectric layer and the first circuit layer; the second dielectric layer can completely cover the first dielectric layer, or can completely cover the first dielectric layer and the first circuit layer; and the second dielectric layer can be provided by physical lamination using a machine.

At S7, a second circuit layer is formed on the second dielectric layer, where the second circuit layer is electrically connected to the first circuit layer and the embedded device.

In this step, after the second dielectric layer is laminated, the second circuit layer connected to the first circuit layer needs to be fabricated on the second dielectric layer. The connections between the first circuit layer and the second circuit layer and between the second circuit layer and the embedded device can all be realized by conductive copper pillars. It should be noted that the second circuit layer in the present disclosure is not limited to one single layer, and may be a second circuit layer composed of a plurality of circuit layers which are electrically connected to each other.

Further, the forming, on the second dielectric layer, a second circuit layer that is electrically connected to the first circuit layer and the embedded device may include the following steps.

At S21, a first conductive copper pillar and a second conductive copper pillar are formed, where the first conductive copper pillar is configured to connect the first circuit layer and the second circuit layer, and the second conductive copper pillar is configured to connect the second circuit layer and the embedded device.

At S22, the second circuit layer electrically connected to the first circuit layer and the embedded device is formed through the first conductive copper pillar and the second conductive copper pillar.

In this embodiment, the first conductive copper pillar and the second conductive copper pillar can be formed first. The first conductive copper pillar can be configured to electrically connect the first circuit layer and the second circuit layer. When there are the first dielectric layer and the second dielectric layer between the first circuit layer and the second circuit layer, the first conductive copper pillar needs to extend through both the first dielectric layer and the second dielectric layer. When there is only the second dielectric layer between the first circuit layer and the second circuit layer, the first conductive copper pillar needs to extend through only the second dielectric layer, while the second conductive copper pillar needs to extend through both the first dielectric layer and the second dielectric layer. After the first conductive copper pillar and the second conductive copper pillar are formed, the second circuit layer can be directly formed by an electroplating process, or a metal seed layer can be formed first, followed by using existing processes such as covering the metal seed layer with a photosensitive film, performing exposure and development, and etching to form the second circuit layer.

Further, the forming the second circuit layer that is electrically connected to the first circuit layer and the embedded device through the first conductive copper pillar and the second conductive copper pillar may include the following steps.

At S31, a metal seed layer connected to the first conductive copper pillar and the second conductive copper pillar is formed.

At S32, a photosensitive film application process, an exposure and development process, and a pattern electroplating process are performed on the metal seed layer to obtain the second circuit layer connected to the first conductive copper pillar and the second conductive copper pillar.

In this embodiment, the second circuit layer connected to the first and second conductive copper pillars can be obtained by first producing a metal seed layer, then using conventional processes such as attaching the photosensitive film to the metal seed layer, performing exposure and development on the photosensitive film, and then pattern electroplating.

Further, the forming the first conductive copper pillar and the second conductive copper pillar may include the following steps.

At S41, the first circuit layer and the pin face of the embedded device are exposed through a laser drilling process to form a first through hole and a second through hole.

At S42, the first conductive copper pillar and the second conductive copper pillar are formed in the first through hole and the second through hole, respectively, through a hole filling and electroplating process.

In this embodiment, the dielectric layers can be drilled by laser drilling or other drilling techniques to form the first through hole and the second through hole, such that the first circuit layer and the pin face of the embedded device are exposed; and then, the first conductive copper pillar and the second conductive copper pillar extending through the dielectric layer(s) are formed in the first through hole and the second through hole, respectively, through the hole filling and electroplating process. The first conductive copper pillar may be configured to connect the first circuit layer and the second circuit layer, and the second conductive copper pillar may connect the embedded device and the second circuit layer.

Further, in some embodiments of the present disclosure, both the first photosensitive layer and the second photosensitive layer may be adhesive photosensitive materials. The adhesive photosensitive material can increase the adhesion between the embedded device and the first photosensitive layer and stabilize the embedded device. The adhesive photosensitive material can also increase the adhesion between the second photosensitive layer and the second dielectric layer, thus increasing the adhesion therebetween, and reducing the risk of delamination.

Further, in some embodiments of the present disclosure, the second dielectric layer may include a resin-based dielectric material. The second dielectric layer can also be made of other materials with greater structural strength than adhesive photosensitive materials, such as PP materials reinforced by glass fibers, composite materials composed of resin materials and other materials, etc. The materials with greater structural strength can further reduce the risk of delamination and can also reduce the risk of plate cracking of the substrate during subsequent manufacturing processes and actual use.

Further, in some embodiments of the present disclosure, the preset threshold may be 3 μm. The thickness of 3 μm can protect the embedded device from damage caused by lamination, high temperature and other conditions in subsequent processes, thus ensuring the functionality of the device and the finished product.

Figure 2:
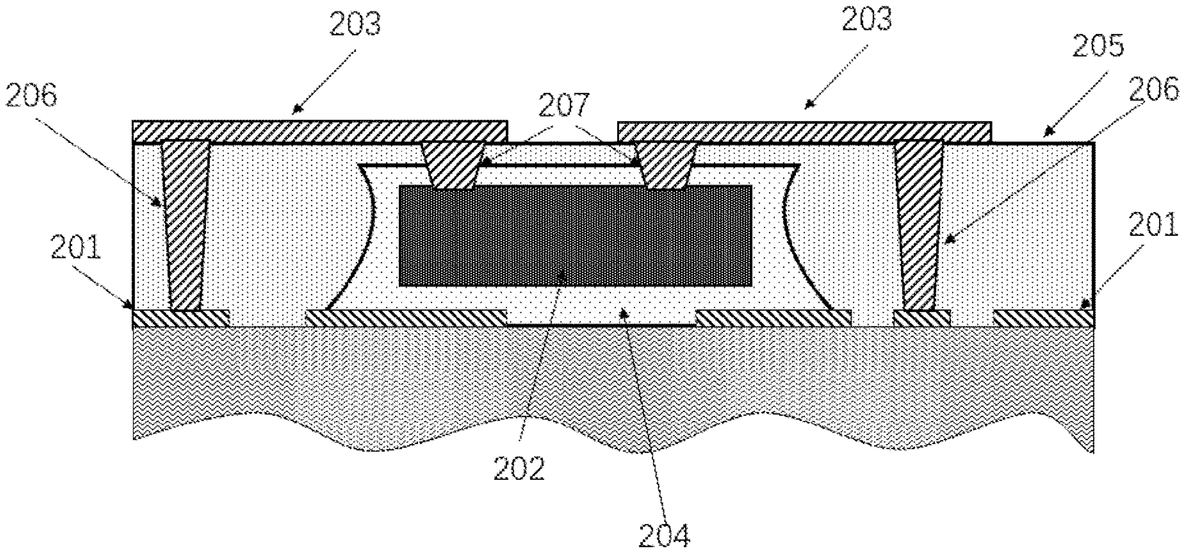
FIG. 2 is a schematic diagram of a packaging substrate according to an embodiment of the present disclosure.

In addition, corresponding to the method of FIG. 1, a further embodiment of the present disclosure provides a packaging substrate which, referring to FIG. 2, may include: a first circuit layer 201, an embedded device 202, a second circuit layer 203, a first dielectric layer 204, and a second dielectric layer 205, where the first dielectric layer 204 may include a first photosensitive layer and a second photosensitive layer; the first dielectric layer 204 may cover the embedded device 202; the second dielectric layer 205 may cover the first dielectric layer 204; the second dielectric layer 205 may be arranged between the first circuit layer 201 and the second circuit layer 203; the first circuit layer 201 may be connected to the second circuit layer 203; and the second circuit layer 203 is connected to the embedded device 202.

Further, referring to FIG. 2, in some embodiments of the present disclosure, the packaging substrate may further include a first conductive copper pillar 206 and a second conductive copper pillar 207, where the first conduction copper pillar 206 is configured to electrically connect the first circuit layer 201 and the second circuit layer 202, and the second conductive copper pillar 207 is configured to electrically connect the second circuit layer 203 and the embedded device 202.

It should be noted that the contents of the above method embodiments are all applicable to the embodiments of the packaging substrate. The specific functions achieved by the embodiments of the packaging substrate are the same as those of the above-described method embodiments, and the beneficial effects achieved are also the same as those of the above-described method embodiments.

In addition, corresponding to the packaging substrate of the above embodiment, a still further embodiment of the present disclosure provides a semiconductor which may include a packaging substrate described in any of the above embodiments.

It should be noted that the contents of the above-described embodiments of the packaging substrate are all applicable to the embodiment of the semiconductor. The specific functions achieved by the embodiment of the semiconductor are the same as those of the above-described embodiments of the packaging substrate, and the beneficial effects achieved are also the same as those of the above-described embodiments of the packaging substrate.

The method for manufacturing embedded device packaging substrate of the present disclosure will be described with reference to the accompanying drawings hereinafter.

Embodiment I

In this embodiment, the first photosensitive layer and the second photosensitive layer are made of adhesive photosensitive materials, and the preset threshold value is set to 3 μm.

Figure 3:
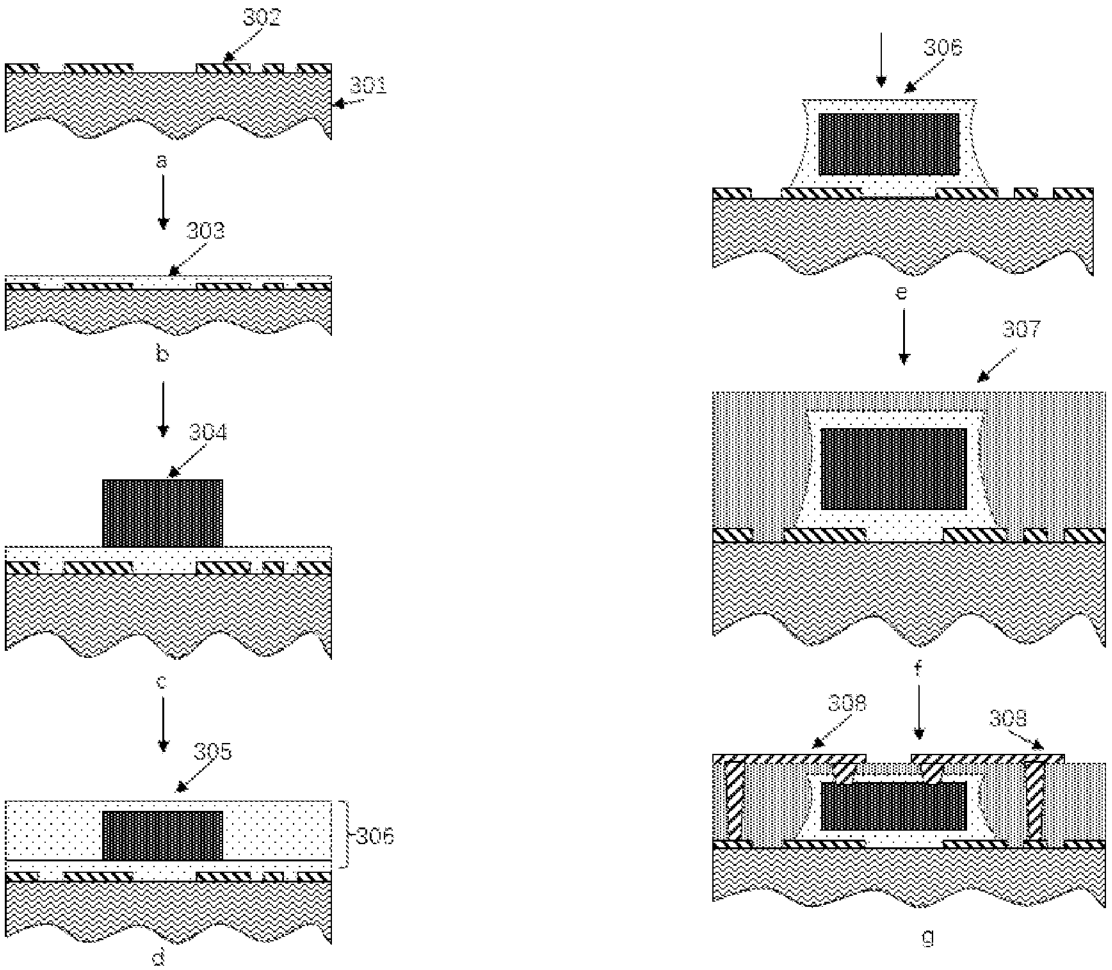
FIG. 3 is a schematic diagram showing the structural changes of a substrate fabricated by a method for manufacturing embedded device packaging substrate according to an embodiment of the present disclosure.

Referring to diagrams a-f in FIG. 3, a first circuit layer 302 is formed on a carrier plate 301 by an existing technology process; then, a first adhesive photosensitive layer 303 is laminated onto the first circuit layer 302; next, an embedded device 304 is placed on the first adhesive photosensitive layer 303 with pins of the embedded device 304 facing upward and a back face of the embedded device 304 being bonded to the first adhesive photosensitive layer 303; next, a second adhesive photosensitive layer 305 is placed over the first adhesive photosensitive layer 303 and the embedded device 304, and the first adhesive photosensitive layer 303 and the second adhesive photosensitive layer 305 can form a first dielectric layer 306; next, the first dielectric layer 306 is partially removed, such that the minimum thickness of the first dielectric layer 306 covering a side surface of the embedded device 304 is greater than or equal to 3 μm while the first circuit layer 302 is exposed; next, a second dielectric layer 307 can be laminated onto the first dielectric layer 306 and the first circuit layer 302, where the second dielectric layer 307 covers the first dielectric layer 306 and the first circuit layer 302, and the first dielectric layer covers the embedded device 304; and finally, a second circuit layer 308 electrically connected to the first circuit layer 302 and the embedded device 304 is formed on the second dielectric layer 307.

Embodiment II

In this embodiment, the first photosensitive layer and the second photosensitive layer are made of adhesive photosensitive materials, and the preset threshold value is set to 3 μm.

Figure 4:
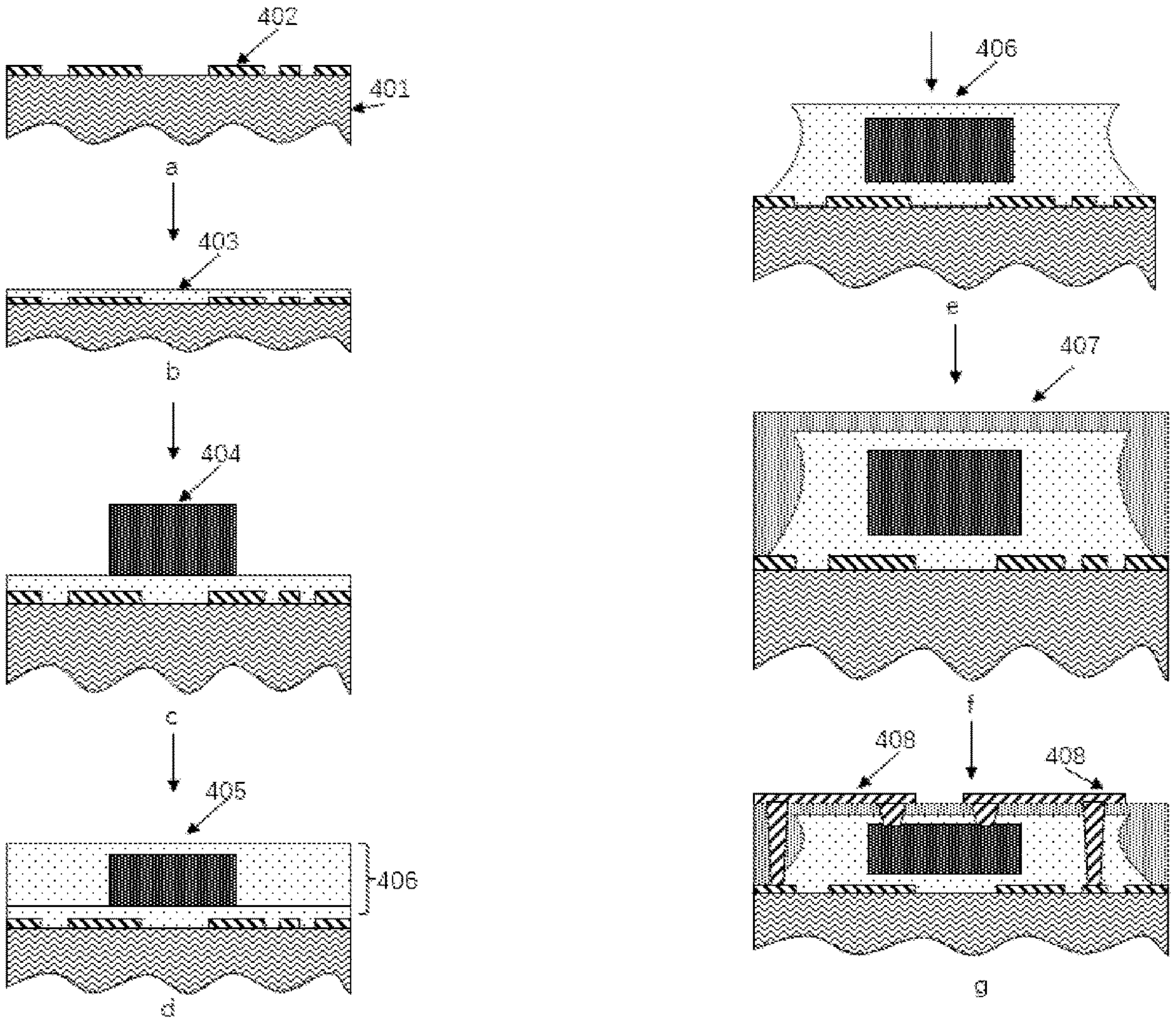
FIG. 4 is another schematic diagram showing the structural changes of a substrate fabricated by a method for manufacturing embedded device packaging substrate according to an embodiment of the present disclosure.

Referring to diagrams a-f in FIG. 4, a first circuit layer 402 is formed on a carrier plate 401 by a existing technology process; then, a first adhesive photosensitive layer 403 is laminated onto the first circuit layer 402; next, an embedded device 404 is placed on the first adhesive photosensitive layer 403 with pins of the embedded device 404 facing upward and a back face of the embedded device 404 being bonded to the first adhesive photosensitive layer 403; next, a second adhesive photosensitive layer 405 is placed over the first adhesive photosensitive layer 403 and the embedded device 404, and the first adhesive photosensitive layer 403 and the second adhesive photosensitive layer 405 can form a first dielectric layer 406; next, the first dielectric layer 406 is partially removed, such that the minimum thickness of the first dielectric layer 406 covering a side surface of the embedded device 404 is greater than or equal to 3 μm; next, a second dielectric layer 407 can be laminated onto the first dielectric layer 406, where the second dielectric layer 407 covers the first dielectric layer 406, and the first dielectric layer 406 covers the embedded device 404 and the first circuit layer 402; and finally, a second circuit layer 408 electrically connected to the first circuit layer 402 and the embedded device 404 is formed on the second dielectric layer 407.

In some optional embodiments, the functions/operations mentioned in the block diagram may not be performed in the order mentioned in the operation diagram. For example, depending on the functions/operations involved, two blocks shown in succession may in fact be performed substantially simultaneously or the two blocks may sometimes be performed in reverse order. Further, the embodiment presented and described in the flow chart of the present disclosure are provided by way of example in order to provide a more comprehensive understanding of the techniques. The disclosed method is not limited to the operations and logical flows presented herein. Optional embodiments are contemplated in which the order of various operations is changed and in which sub-operations described as part of a larger operation are performed independently.

In the foregoing description, the explanation with reference to the terms "an implementation/embodiment", "another implementation/embodiment" or "some implementations/embodiments", etc. means that specific features, structures, materials or characteristics described in connection with the embodiment(s) or example(s) are included in at least one embodiment or example of the present disclosure. In the description, the illustrative expressions of the above-mentioned terms do not necessarily refer to the same embodiments or examples. Moreover, the specific features, structures, materials or characteristics described can be combined in any one or more embodiments or examples in any suitable manner.

Although the embodiments of the present disclosure have been shown and described, it can be understood by those of ordinary skill in the art that various changes, modifications, substitutions and variations may be made to these embodiments without departing from the principles and objectives of the present disclosure, and the scope of the present disclosure is defined by the claims and their equivalents.

The above is a detailed description of the preferred implementation of the present disclosure, but the present disclosure is not limited to the embodiments described above. Those of ordinary skill in the art can also make various equivalent modifications or replacements without departing from the gist of the present disclosure, and these equivalent modifications or replacements are all included in the scope defined by the claims of the present disclosure.

What is claimed is:

1. A method for manufacturing embedded device packaging substrate, comprising:

forming a first circuit layer;

laminating a first photosensitive layer onto the first circuit layer;

providing an embedded device on the first photosensitive layer, with a pin face of the embedded device facing away from the first photosensitive layer;

providing a second photosensitive layer in such a manner that the second photosensitive layer covers the embedded device, wherein materials of the first photosensitive layer and the second photosensitive layer are the same, and the first photosensitive layer and the second photosensitive layer form a first dielectric layer;

partially removing the first dielectric layer such that a minimum thickness of the first dielectric layer covering a side surface of the embedded device is greater than or equal to a preset threshold;

providing a second dielectric layer in such a manner that the second dielectric layer covers the first dielectric layer; and forming, on the second dielectric layer, a second circuit layer that is electrically connected to the first circuit layer and the embedded device;

wherein the forming, on the second dielectric layer, a second circuit layer that is electrically connected to the first circuit layer and the embedded device comprises:

forming a first conductive copper pillar and a second conductive copper pillar, wherein the first conductive copper pillar is configured to connect the first circuit layer and the second circuit layer, and the second conductive copper pillar is configured to connect the second circuit layer and the embedded device; and forming the second circuit layer that is electrically connected to the first circuit layer and the embedded device through the first conductive copper pillar and the second conductive copper pillar;

wherein the forming the first conductive copper pillar and the second conductive copper pillar comprises:

exposing the first circuit layer and the pin face of the embedded device through a laser drilling process to form a first through hole and a second through hole; and forming the first conductive copper pillar and the second conductive copper pillar in the first through hole and the second through hole, respectively, through a hole filling and electroplating process;

wherein the first conductive copper pillar extends through only the second dielectric layer, the second conductive copper pillar extends through both the first dielectric layer and the second dielectric layer.

2. The method for manufacturing embedded device packaging substrate of claim 1, wherein the forming the second circuit layer that is electrically connected to the first circuit layer and the embedded device through the first conductive copper pillar and the second conductive copper pillar comprises:

forming a metal seed layer connected to the first conductive copper pillar and the second conductive copper pillar; and performing a photosensitive film application process, an exposure and development process, and a pattern electroplating process on the metal seed layer to obtain the second circuit layer connected to the first conductive copper pillar and the second conductive copper pillar.

3. The method for manufacturing embedded device packaging substrate of claim 1, wherein the materials of the first photosensitive layer and the second photosensitive layer both comprise adhesive photosensitive materials.

4. The method for manufacturing embedded device packaging substrate of claim 1, wherein the second dielectric layer comprises a resin-based dielectric material.

5. The method for manufacturing embedded device packaging substrate of claim 1, wherein the preset threshold is 3 μm.

6. A packaging substrate, obtained by the method for manufacturing embedded device packaging substrate of claim 1, the packaging substrate comprising: a first circuit layer, an embedded device, a second circuit layer, a first dielectric layer, and a second dielectric layer, wherein the first dielectric layer includes a first photosensitive layer and a second photosensitive layer; the first dielectric layer covers the embedded device; the second dielectric layer covers the first dielectric layer; the second dielectric layer is arranged between the first circuit layer and the second circuit layer; the first circuit layer is connected to the second circuit layer; and the second circuit layer is connected to the embedded device;

the packaging substrate further comprising: a first conductive copper pillar and a second conductive copper pillar, wherein the first conductive copper pillar is configured to electrically connect the first circuit layer and the second circuit layer, and the second conductive copper pillar is configured to electrically connect the second circuit layer and the embedded device, wherein the first conductive copper pillar extends through only the second dielectric layer, the second conductive copper pillar extends through both the first dielectric layer and the second dielectric layer.

7. A semiconductor, comprising the packaging substrate of claim 6.

* * * * *